(12) United States Patent
Sharma et al.

(10) Patent No.: US 8,895,874 B1
(45) Date of Patent: Nov. 25, 2014

(54) INDIUM-LESS TRANSPARENT METALIZED LAYERS

(75) Inventors: Sunity Kumar Sharma, Fremont, CA (US); Alex Newsom Beavers, Jr., Menlo Park, CA (US); Thomas Furst, Menlo Park, CA (US)

(73) Assignee: Averatek Corp., Santa Clara, CA (US)

( * ) Notice: Subject to any disclaimer, the term of this patent is extended or adjusted under 35 U.S.C. 154(b) by 698 days.

(21) Appl. No.: 12/721,557

(22) Filed: Mar. 10, 2010

Related U.S. Application Data

(60) Provisional application No. 61/159,037, filed on Mar. 10, 2009.

(51) Int. Cl.
*H01L 23/552* (2006.01)
*C23C 14/48* (2006.01)

(52) U.S. Cl.
USPC ........... 174/350; 174/357; 313/112; 313/326; 313/348; 313/479; 313/492; 427/523; 427/531

(58) Field of Classification Search
CPC .. H01L 23/552; H05K 1/0218; H05K 9/0015; H01K 1/32; C23C 14/024; C23C 14/025
USPC ........... 174/350, 357; 427/523, 531; 313/112, 313/326, 348, 479, 492
See application file for complete search history.

(56) References Cited

U.S. PATENT DOCUMENTS

| | | | |
|---|---|---|---|
| 3,421,922 A | 1/1969 | Wilson | |
| 3,793,072 A | 2/1974 | Lando | |
| 3,853,589 A | 12/1974 | Andrews | |
| 3,881,049 A | 4/1975 | Brandt et al. | |
| 3,930,963 A | 1/1976 | Polichette et al. | |
| 3,937,857 A | 2/1976 | Brummett et al. | |
| 3,963,841 A | 6/1976 | Anschel et al. | |
| 3,969,554 A | 7/1976 | Zeblisky | |
| 4,451,666 A | 5/1984 | Sofranko et al. | |

(Continued)

FOREIGN PATENT DOCUMENTS

| GB | 1154152 | 6/1969 |
|---|---|---|
| JP | 62-211935 | 9/1987 |

(Continued)

OTHER PUBLICATIONS

Francis et al., Advanced Organic Chemistry: Part A, Springer, 2007.

(Continued)

*Primary Examiner* — Cathy Lam
(74) *Attorney, Agent, or Firm* — McDonnell Boehnen Hulbert & Berghoff LLP

(57) ABSTRACT

Thin indium-less "optically porous" layers adapted to replace traditional ITO layers are provided herein. A thin metalized film adapted to carry an electrical charge can include a dense pattern of small openings to allow the transmission of light to or from an underlying semiconductor material. The pattern of openings can create a regular or irregular grid pattern of low aspect ratio fine-line metal conductors. Creation of this optically porous metalized film can include the printing of a catalytic precursor material, such as palladium in solution in a pattern on a substrate, drying or curing the catalytic precursor, and the deposition of a thin layer of metal, such as copper on the dried precursor to form the final conductive and optically porous film.

8 Claims, 8 Drawing Sheets

(56) References Cited

U.S. PATENT DOCUMENTS

| | | | |
|---|---|---|---|
| 4,486,466 | A | 12/1984 | Leech et al. |
| 4,715,935 | A | 12/1987 | Lovie et al. |
| 4,734,299 | A | 3/1988 | Matuzaki et al. |
| 4,873,123 | A | 10/1989 | Canestaro et al. |
| 4,976,990 | A | 12/1990 | Bach et al. |
| 5,021,398 | A | 6/1991 | Sharma et al. |
| 5,179,060 | A | 1/1993 | Subramanian et al. |
| 5,200,272 | A | 4/1993 | Sirinyan et al. |
| 5,281,447 | A | 1/1994 | Brady et al. |
| 5,302,467 | A | 4/1994 | Baumgartner et al. |
| 5,332,646 | A | 7/1994 | Wright et al. |
| 5,464,692 | A | 11/1995 | Huber |
| 5,478,462 | A | 12/1995 | Walsh |
| 5,527,566 | A | 6/1996 | Schadt et al. |
| 5,648,125 | A | 7/1997 | Cane |
| 5,721,007 | A | 2/1998 | Lynch et al. |
| 5,846,615 | A | 12/1998 | Sharma et al. |
| 5,894,038 | A | 4/1999 | Sharma et al. |
| 5,980,813 | A | 11/1999 | Narang et al. |
| 5,980,998 | A | 11/1999 | Sharma et al. |
| 6,086,979 | A * | 7/2000 | Kanbara et al. ............ 428/209 |
| 6,165,912 | A | 12/2000 | McConnell et al. |
| 6,174,353 | B1 | 1/2001 | Yuan et al. |
| 6,265,086 | B1 | 7/2001 | Harkness |
| 6,395,332 | B1 | 5/2002 | Hanawa et al. |
| 6,495,200 | B1 | 12/2002 | Chan et al. |
| 6,548,122 | B1 | 4/2003 | Sharma et al. |
| 6,663,915 | B2 | 12/2003 | Palmans et al. |
| 6,733,823 | B2 | 5/2004 | Lee et al. |
| 6,775,907 | B1 | 8/2004 | Boyko et al. |
| 6,824,666 | B2 | 11/2004 | Gandikota et al. |
| 6,855,378 | B1 | 2/2005 | Narang |
| 6,882,091 | B2 * | 4/2005 | Kotsubo et al. ............ 313/112 |
| 6,911,385 | B1 | 6/2005 | Haubrich et al. |
| 6,972,078 | B1 | 12/2005 | Tsou et al. |
| 6,991,876 | B2 | 1/2006 | Narang et al. |
| 7,244,159 | B2 * | 7/2007 | Kotsubo ............ 445/49 |
| 7,390,920 | B2 | 6/2008 | Coleman et al. |
| 7,931,518 | B2 * | 4/2011 | Kotsubo et al. ............ 445/49 |
| 7,981,508 | B1 | 7/2011 | Sharma et al. |
| 7,989,029 | B1 | 8/2011 | Dhau et al. |
| 8,110,254 | B1 | 2/2012 | Sharma et al. |
| 8,124,226 | B2 | 2/2012 | Sharma et al. |
| 2002/0182308 | A1 | 12/2002 | Lee et al. |
| 2005/0238812 | A1 | 10/2005 | Bhangale et al. |
| 2012/0100286 | A1 | 4/2012 | Sharma et al. |

FOREIGN PATENT DOCUMENTS

| | | |
|---|---|---|
| JP | 09064309 A | 3/1997 |
| JP | 2004-183048 | 7/2004 |
| WO | WO 96/27691 | 9/1996 |

OTHER PUBLICATIONS

Gilleo, Handbook of Flexible Circuitry, Springer, 1998, pp. 20-23.
Stearns, Flexible Printed Circuitry, McGraw-Hill Professional, 1995, pp. 125-126.
Thomas et al., "Single-Site Heterogeneous Catalysts", *Angewandte Chemie International Edition*, vol. 44, Issue 40, Oct. 14, 2005, pp. 6456-6482.
U.S. Appl. No. 11/520,341, filed Sep. 12, 2006.
Office Action dated Aug. 6, 2010, from U.S. Appl. No. 11/854,271.
Final Office Action dated Jan. 7, 2011, from U.S. Appl. No. 11/854,271.
Notice of Allowance dated Dec. 16, 2011, from U.S. Appl. No. 11/854,271.
Office Action dated Jun. 19, 2009, from U.S. Appl. No. 11/854,274.
Final Office Action dated Jan. 7, 2010, from U.S. Appl. No. 11/854,274.
Office Action dated Sep. 10, 2010, from U.S. Appl. No. 11/854,274.
Notice of Allowance dated Mar. 9, 2011, from U.S. Appl. No. 11/854,274.
Office Action dated Dec. 14, 2009, from U.S. Appl. No. 11/854,277.
Final Office Action dated May 18, 2010, from U.S. Appl. No. 11/854,277.
Office Action dated Sep. 9, 2010, from U.S. Appl. No. 11/854,277.
Final Office Action dated Jan. 4, 2011, from U.S. Appl. No. 11/854,277.
U.S. Appl. No. 12/142,577, filed Jun. 19, 2008.
Office Action dated Dec. 1, 2009, from U.S. Appl. No. 12/142,577.
Final Office Action dated Apr. 7, 2010, from U.S. Appl. No. 12/142,577.
Office Action dated Aug. 6, 2010, from U.S. Appl. No. 12/142,577.
Final Office Action dated Mar. 11, 2011, from U.S. Appl. No. 12/142,577.
Appeal Brief filed Oct. 24, 2011, in U.S. Appl. No. 12/142,577.
Reply Brief filed Feb. 8, 2012, in U.S. Appl. No. 12/142,577.
Office Action dated Nov. 15, 2010, from U.S. Appl. No. 12/143,737.
Notice of Allowance dated Mar. 21, 2011, from U.S. Appl. No. 12/143,737.
Office Action dated Nov. 10, 2010, from U.S. Appl. No. 12/779,867.
Final Office Action dated Feb. 10, 2011, from U.S. Appl. No. 12/779,867.
Office Action dated Jun. 21, 2011, from U.S. Appl. No. 13/078,831.
Notice of Allowance mailed Jan. 17, 2012, in related U.S. Appl. No. 13/078,831.
Office Action mailed Apr. 11, 2012, in related U.S. Appl. No. 13/341,828.

* cited by examiner

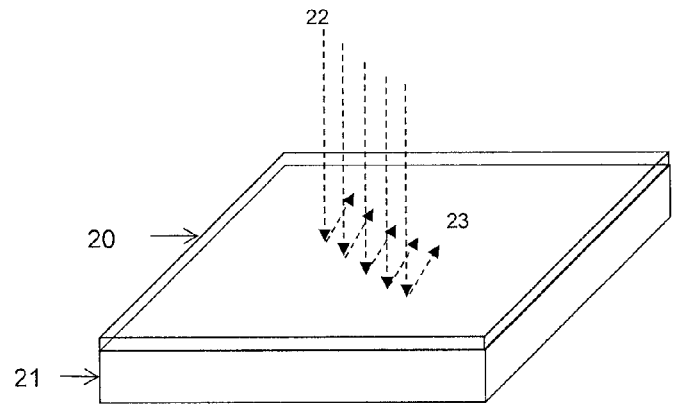
FIG. 2 *(prior art)*
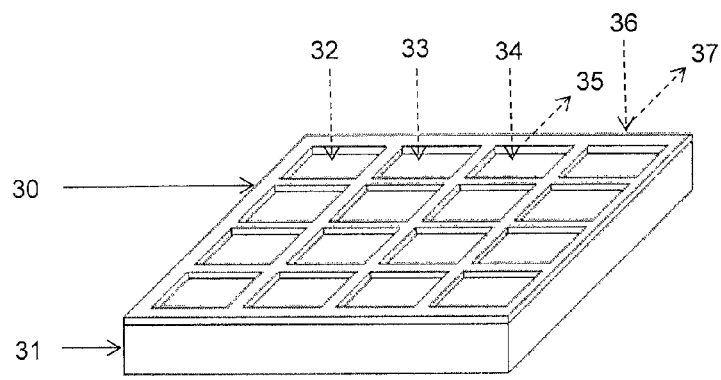
FIG. 3
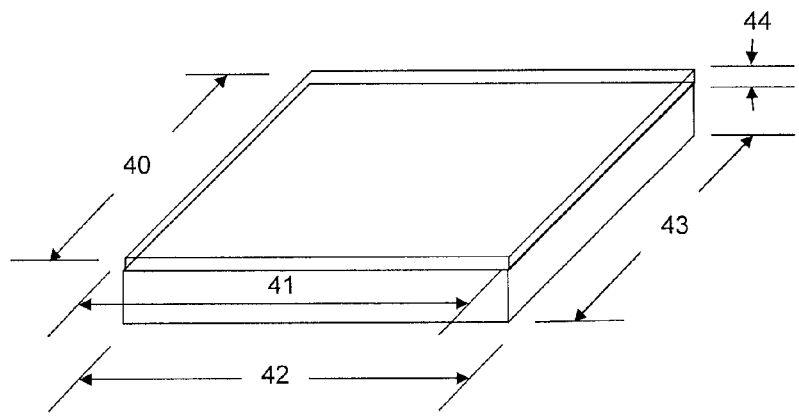
FIG. 4 *(prior art)*

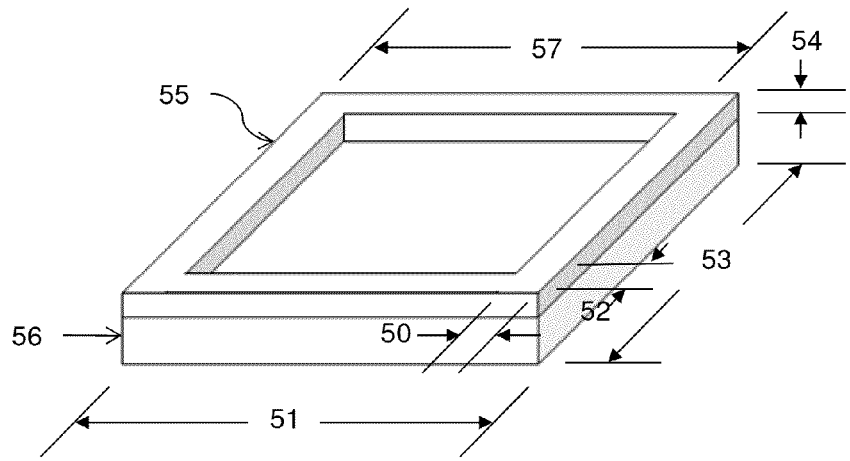

FIG. 5

| Transparency Scenarios | | | | | | | |
|---|---|---|---|---|---|---|---|
| Dimensions | Units | Values | | | | | |
| Total Substrate | | | | | | | |
| $X_s$ | micron | 250 | 250 | 250 | 250 | 250 | 250 |
| $Y_s$ | micron | 250 | 250 | 250 | 250 | 250 | 250 |
| $A_s$ | sq micron | 62500 | 62500 | 62500 | 62500 | 62500 | 62500 |
| Percent of $A_s$ | % | 100% | 100% | 100% | 100% | 100% | 100% |
| Copper surface | | | | | | | |
| $X_c$ | micron | 30 | 25 | 20 | 15 | 10 | 5 |
| $Y_c$ | micron | 30 | 25 | 20 | 15 | 10 | 5 |
| $A_c$ | sq micron | 26400 | 22500 | 18400 | 14100 | 9600 | 4900 |
| Percent of $A_s$ | % | 42% | 36% | 29% | 23% | 15% | 8% |
| $X_c$ as % of $X_s$ | % | 12% | 10% | 8% | 6% | 4% | 2% |
| $Y_c$ as % of $Y_s$ | % | 12% | 10% | 8% | 6% | 4% | 2% |
| Copper line width a % of $X_s$ | % | 24% | 20% | 16% | 12% | 8% | 4% |
| Exposed Substrate | | | | | | | |
| Xse | micron | 190 | 200 | 210 | 220 | 230 | 240 |
| Yse | micron | 190 | 200 | 210 | 220 | 230 | 240 |
| $A_{se}$ | sq micron | 36100 | 40000 | 44100 | 48400 | 52900 | 57600 |
| Percent of $A_s$ | % | 58% | 64% | 71% | 77% | 85% | 92% |

FIG. 6

| Resistance Comparisons | | | | | | | | |
|---|---|---|---|---|---|---|---|---|
| Scenario | R | rho | L ($Y_c$ or ITO) | | $Z_c$ or ITO | $X_c$ or ITO | A | |
| | ohm | ohm cm | micron | cm | micron | micron | micron2 | cm2 |
| 1 Copper | 8.00E-02 | 1.60E-06 | 2.50E+01 | 2.50E-03 | 0.20 | 25.00 | 5.00E+00 | 5.00E-08 |
| 2 ITO | 2.50E+02 | 1.00E-04 | 2.50E+01 | 2.50E-03 | 0.02 | 5.00 | 1.00E-01 | 1.00E-09 |
| 3 ITO | 3.33E+01 | 1.00E-04 | 2.50E+01 | 2.50E-03 | 0.15 | 5.00 | 7.50E-01 | 7.50E-09 |
| 4 ITO | 3.33E+00 | 1.00E-04 | 2.50E+01 | 2.50E-03 | 0.15 | 50.00 | 7.50E+00 | 7.50E-08 |
| 5 ITO | 6.67E-01 | 1.00E-04 | 2.50E+01 | 2.50E-03 | 0.15 | 250.00 | 3.75E+01 | 3.75E-07 |
| 6 ITO | 4.00E-04 | 1.00E-04 | 2.50E+01 | 2.50E-03 | 250.00 | 250.00 | 6.25E+04 | 6.25E-04 |

FIG. 7

| Dim | Units | Values | | |
|---|---|---|---|---|
| | | Avg | Low | High |
| Total Substrate | | | | |
| $X_s$ | micron | 25 | | |
| $Y_s$ | micron | 25 | | |
| $A_s$ | sq micron | 625 | | |
| Copper surface | | | | |
| $X_c$ | micron | 1.0 | 1.1 | 0.8 |
| $Y_c$ | micron | 1.0 | 1.1 | 0.8 |
| $A_c$ | sq micron | 96.0 | 100.6 | 77.4 |
| Exposed Substrate | | | | |
| Xse | micron | 23.0 | 22.9 | 23.4 |
| Yse | micron | 23.0 | 22.9 | 23.4 |
| $A_{se}$ | sq micron | 529.0 | 524.4 | 547.6 |
| % | % | 85% | 84% | 88% | ns
INDIUM-LESS TRANSPARENT METALIZED LAYERS

CROSS-REFERENCE TO RELATED APPLICATION

This application claims priority to U.S. Provisional Application No. 61/159,037 filed on Mar. 10, 2009, entitled "METALIZED SURFACE WITH ARRAYED OPENINGS FOR ITO REPLACEMENT," which is incorporated by reference herein in its entirety and for all purposes.

TECHNICAL FIELD

The present invention relates generally to the formation of electronic components, and more particularly to the use of conductive and transparent layers in the formation of electrodes and other charge carrying items.

BACKGROUND

Indium tin oxide ITO is a solid solution of indium (III) oxide ($In_2O_3$) and tin (IV) oxide ($SnO_2$), typically 90%/10% by weight. ITO is electrically conductive, optically transparent, and colorless in thin layers. Because this particular combination of material attributes is quite rare, the value of ITO for use in numerous electronics applications that can utilize this combination of attributes is notably high. Deposition techniques used for ITO include electron beam evaporation, physical vapor deposition, and sputter deposition.

ITO is used as a transparent conductive oxide (TCO) electrode layer in electronic devices such as organic light emitting diodes, photodetectors, silicon photovoltaics, organic photovoltaics (OPV), liquid crystal displays, plasma displays, touch panels, antistatic coatings and electromagnetic interference shielding, among others. The popularity of these electronic devices has lead to a consistent and significant growth in sales of these devices, which has lead to a rapidly growing demand for ITO material. This rapidly growing demand has lead to rapid increases in the cost of the ITO materials and to a growing concern in the industry about this cost growth and newly emerging performance problems.

ITO has several economic and performance problems that require resolution, however. The first economic problem is that indium is a precious metal that has undergone price escalation over recent years as its use has increased dramatically in comparison to the amount of ITO that is available. A second economic problem is that the deposition process for most product applications utilizing ITO is accomplished by way of expensive vacuum sputtering methods.

One performance problem is that ITO can be relatively brittle, which makes it relatively difficult to use ITO on flexible circuit material. Given that one important growth potential for ITO is in electronic components that make extensive use of flexible electronic substrates, this will become a growing problem. Another performance problem is the=relative inefficiency in the conversion of electrons into photons in ITO applications for OLEDS. In an OLED application, light is trapped in the ITO layer due to its higher refractive index in comparison to the organic materials. This results in less than 25% of the generated photons actually coming out of the device and become useful.

Although many devices and techniques for providing conductive and transparent layers in electronics applications have generally worked well in the past, there is always a desire to provide alternatives for such layers. In particular, what is desired are conductive and transparent layers having a lower cost, better performance, and greater ease of manufacturability than traditional ITO layers.

SUMMARY

It is an advantage of the present invention to provide conductive and transparent layers that cost less, perform better, and are easier to manufacture than traditional ITO layers. In particular, the inventive layers provided herein are a superior substitute for such traditional ITO layers. This can be accomplished at least in part through the use of thin metalized layers having arrays of tiny openings therethrough, such that conductivity and transparency are both achieved.

The present invention involves replacing TCO materials, such as ITO, with a metalized surface layer that has an array of openings to allow the transmission of light to or from a semiconductor material underneath the metalized surface. This thin layer of metal has a dense array of openings that allow the majority of light to pass therethrough. This transparent or "optically porous" metal film is created by the deposition of a thin layer of metal with an array of openings of various shapes. The pattern or array of openings creates a regular or irregular grid pattern of low aspect ratio fine-line metal conductors.

The present invention generally involves creating a metalized surface that has an array of openings by using a print-and-plate process. Such a print-and-plate process offers an effective and economical method to create a thin layer of metal with a dense array of openings on a production scale. This print-and-plate involves the deposition of a precursor catalytic liquid on the substrate in a particular pattern, drying or curing the liquid pattern at a temperature that releases or activates the catalyst dissolved therein, and immersing the substrate with the dried or cured catalyst material pattern in an electroless copper plating bath, which deposits a thin layer of copper on the substrate surface only where there is dried catalytic material.

In various embodiments of the present invention, an apparatus adapted for use in an electronic device includes a substrate having a first surface, a catalytic precursor deposited in a pattern on said first surface, and an electrically conductive layer disposed over said catalytic precursor such that the electrically conductive layer reflects the pattern of said catalytic precursor. The patterned electrically conductive layer can be adapted to carry an electrical charge substantially therethroughout, and can also include a plurality of fine openings therethrough that results in the layer being optically porous to expose the majority of the first surface of the substrate.

In various embodiments of the present invention, methods for producing an optically-porous electrically-conductive layer on a substrate are provided. Process steps can include depositing a liquid catalytic precursor solution having a solvent and palladium onto a first surface of a substrate in a pattern, exposing the liquid catalytic precursor solution to conditions that promote evaporation of the solvent to leave a palladium precursor on the substrate, and depositing a conductive material layer atop the palladium. Similar to the foregoing, the conductive material layer can be adapted to carry an electrical charge substantially therethroughout, and can also include a plurality of fine openings therethrough that results in said layer being optically porous to expose the majority of the substrate.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures and arrangements for the disclosed inventive indium-less transparent metalized layers. These drawings in no way limit any changes in form and detail that may be made to the invention by one skilled in the art without departing from the spirit and scope of the invention.

FIG. 2 illustrates in top perspective view the structure of a conventional layer of ITO deposited on a substrate.

FIG. 3 illustrates in top perspective view an exemplary indium-less, conductive and optically porous layer deposited on a substrate according to one embodiment of the present invention.

FIG. 4 depicts various variables assigned to key dimensions of the structure shown in FIG. 2.

FIG. 5 depicts various variables assigned to key dimensions of the structure shown in FIG. 3 according to one embodiment of the present invention.

FIG. 6 is a table of light transmission calculations for different widths of copper lines in the copper grid model according to various embodiments of the present invention.

FIG. 7 is a table of resistance calculations for a given thickness of copper versus a thickness of ITO.

DETAILED DESCRIPTION

Figure 1A:
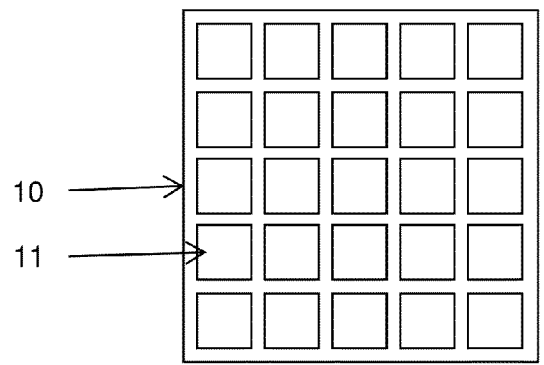
FIGS. 1A-1D illustrate in top plan view various exemplary geometries of optically porous metal films having arrays of fine openings of different exemplary shapes according to various embodiments of the present invention.
Figure 1B:
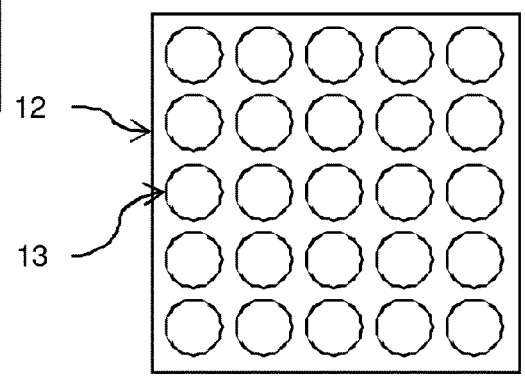
Figure 1C:
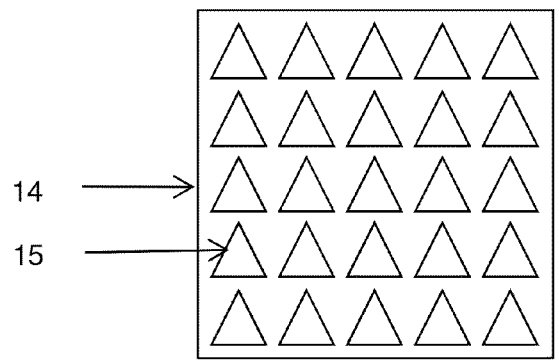
Figure 1D:
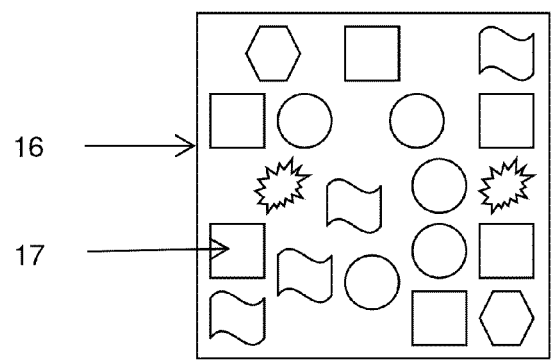

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention.

The invention relates in various embodiments to the fabrication of thin metalized layers or films on a wide variety of substrates, including rigid, flexible and non-flat substrates. The inventive thin metalized layers or films provided herein can be used to replace transparent conductive oxides, such as ITO, that are used as an electrical conductor and a transparent layer in many electronic components. In some embodiments, the thin patterned film can be formed by printing a catalytic precursor material, such as a palladium precursor, in a pattern on the substrate and then forming the metal pattern around the cured catalytic precursor material. Alternatively, additive, semi-additive or subtractive techniques may be used for obtaining the final metal or conductive layer pattern. Such techniques can include, for example, conventional lithography, laser ablation, and mask sputtering processes, although others are certainly possible.

The present invention involves providing alternatives for TCO materials, such as ITO, by using a conductive film or layer having numerous openings that allows the transmission of light to the semiconductor material underneath the conductive film or layer. This thin conductive layer, which can be copper or another suitable metal, for example, has a dense array of openings that allows the majority of light to pass through to an underlying substrate. This optically-porous electrically-conductive film can be created by depositing a low aspect ratio pattern of fine-line metal using a print-and-plate or other suitable process, such as that which is provided below. This offers an effective and economical method to create a thin layer of metal with a dense array of openings on a production scale.

Turning first to FIGS. 1A through 1D, various exemplary geometries of optically porous metal films having arrays of fine openings of different exemplary shapes according to various embodiments of the present invention are provided in top plan view. In the specific embodiment of FIG. 1A, the geometry of an optically porous metal film includes a layer of conductive metal 10 which has an array of openings 11 that are rectangular in shape. In another specific embodiment illustrated in FIG. 1B, the geometry of an optically porous metal film includes a layer of conductive metal 12 having an array of openings 13 that are circular in shape. In another specific embodiment illustrated in FIG. 1C, the geometry of an optically porous metal film includes a layer of conductive metal 14 which has an array of openings 15 that are triangular in shape. In yet another specific embodiment illustrated in FIG. 1D, the geometry of an optically porous metal film includes a layer of conductive metal 16 having an array of openings 17 where the openings are a variety of regular and irregular shapes. These differing embodiments represent a small portion of the various varieties of patterns and shapes that can be used for such a conductive layer having an array of openings therethrough, such that the foregoing examples are not meant to be limiting in any way.

Moving next to FIG. 2, a thin layer of conventional optically transparent and electrically conductive material 20, which can be ITO, for example, has been deposited on one side of a semiconductor substrate 21. Semiconductor substrate 21 can react to photons 22 that are transmitted through the optically transparent layer 20. As shown in FIG. 2, such a layer of ITO will typically include a reflected portion 23 that ranges from about 15% to 25% of the light that falls on it, depending on its thickness, temperature, and other conditions. The thickness of an ITO layer in practical applications is usually in the range of 20 to 150 nanometers.

The specific embodiment of the present invention illustrated in FIG. 3 provides a good substitute for a conventional ITO or similar layer. The component of FIG. 3 includes a conducting grid of copper 30 deposited on a substrate layer 31 with square or rectangular openings 32 that allow photons 33, 34 to travel to the surface of the substrate 31 without resistance. The photons that pass through the openings 33, 34 are either absorbed by the substrate 31 or reflected by the substrate 35, and the photons that fall upon the metal surface 36 are reflected 37 away from the substrate. The metal surface 30 is electrically conductive and allows any electrons released by the substrate material as it absorbs photons to become part of an electrical circuit. This figure illustrates how an optically porous metal film can functionally replace the TCO layer illustrated in FIG. 2. Although the openings in FIG. 3 are rectangular, it will be readily appreciated that these openings could have a wide variety of suitable shapes and sizes, such as the exemplary shapes and sizes as shown in FIGS. 1A-1D.

The space between the copper traces in the grid allows transmission of light directly to the substrate. Any light that falls on the copper surface is either reflected or absorbed. Because the resistivity of copper is $1.6 \times 10^{-8}$ ohm cm, the volume of copper required to achieve the same current carrying capacity of a given volume of ITO is several orders of magnitude less. Therefore, a grid of copper can be very thin with very narrow lines, and yet be able to achieve the same current carrying capacity as a solid layer of ITO.

In order to demonstrate the functional superiority of the embodiment in FIG. 3 to the conventional ITO layer of FIG. 2, FIG. 4 provides an example of the embodiment in FIG. 2 where 40 is the width of an ITO layer, 41 is the length of an ITO layer, 44 is the thickness of an ITO layer, 42 is the length of the substrate layer, and 43 is the width of the substrate layer.

FIG. 5 illustrates an example of the embodiment in FIG. 3 where 50 and 52 are the widths of conducting metal lines that are part of a porous metal layer 55, which can be substantially similar to the illustrated in layer 30 of FIG. 3. in addition, 54 is the thickness the conducting metal lines that are part of the porous metal layer 55, and as illustrated in layer 30 of FIG. 3, 51 is the length of the substrate 56 and 53 is the width of the substrate 56.

FIG. 6 depicts a table of percentage calculations of the photons impinging on the area represented by the substrate 56 that are transmitted without optical resistance from the metal surface 55 to the substrate 56. The table includes a range of transmission percentages for different widths 50 and 53 of metal lines. The calculations in the table indicate that a porous metal surface with rectangular shapes with line widths that range between 5% to 8% of the line spacing distance 57 will allow 85% to 90% of light to reach the substrate, which is equal to or greater than the percentage of light that is effectively transmitted through a thin layer of ITO.

FIG. 7 is a table of the calculations of resistance for a given thickness of metal 54 where the typical values of copper are used versus the typical values of a thickness of ITO 44. These calculations indicate that a grid of very thin (e.g., 0.1 micron) lines of copper would have orders of magnitude less resistance than a typical layer of ITO. These calculations demonstrate how the greater conductivity of a metal such as copper, when deposited in a porous metal geometry such as illustrated in FIG. 3, can provide the same or superior optical porosity and the same or superior electrical conductance of a layer of ITO that would be typically be used in a photovoltaic or light emitting electrical circuit.

In order to confirm the calculations for light transmission from the dimensional models exhibited in FIG. 7, an experiment with an array of metal (in this case chrome) lines on a substrate of glass (quartz) was performed. FIG. 5 illustrates the structure of the experimental sample where 56 is the substrate, 55 is the electrically conductive metal surface, and 50 is the width of the conductive metal lines in the metal surface 55. For the actual experiment conducted, the value of 50 was about 2 microns and the value of 57 the conducting line center-to-center separation was about 25 microns.

Figures 8, 9:
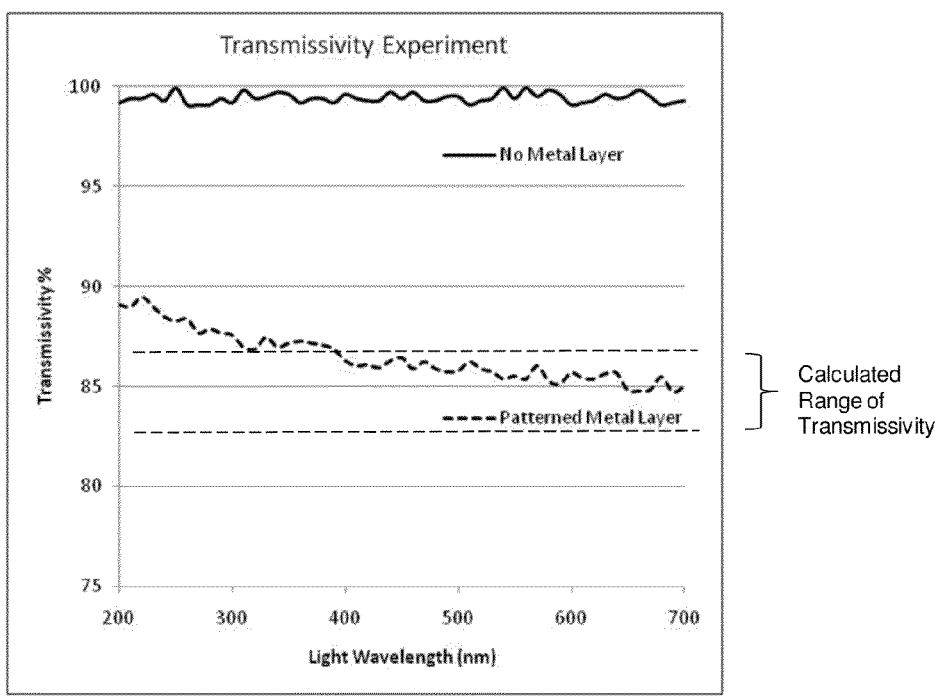
FIG. 8 is a table of theoretical transmission calculations based on the structure of FIG. 5.
FIG. 9 is a chart of the transmission spectra that was measured from the physical experiment that was conducted on the structure of FIG. 5 as modeled in FIG. 8.

FIG. 8 is a table of theoretical transmission calculations based on the structure of FIG. 5. This table depicts how much transmission should be possible assuming no shadowing or diffraction effects. In the experiment, a quartz substrate was used with a metalized surface with rectangular openings as illustrated in FIG. 5. The amount of optical transmission through the openings was measured and compared to that of a blank quartz substrate. The results of this comparison are reported in the chart of FIG. 9.

FIG. 9 is a chart of the transmission spectra that was measured during the experiment. The values measured for the optical transmission of light at different frequencies ranged from 89% to 85%. The calculation of the values for the amount of spectra transmission possible with the configuration of FIG. 5 is based on an assumption that the widths of the conducting lines will vary ±10%. The range for transmissivity based on these calculations is from 83% to 87% with an average of 85%. The experiment falls within this range thus confirming the simple mathematical model which confirms that light transmission through an optically porous metal layer can be equivalent to or superior than that provide by an ITO layer. Thus, a thin metal layer or film having a dense array or pattern of fine openings therethrough is an alternative for a traditional ITO layer that can cost less, perform better, and be easier to manufacture than traditional ITO layers, depending upon the metal and manufacturing processes used.

Various methods and techniques for creating a metalized surface that has a dense array of fine openings are also provided herein. One exemplary formation technique can involve using a print-and-plate process to pattern a catalytic precursor material onto a substrate, and then plate or otherwise form the conductive layer or film around the catalytic precursor material. Such a print-and-plate process can include three basic phases or steps. Step one involves the deposition of a precursor catalytic liquid or solution on the substrate in the pattern required or specified for the conductive metal surface. Step two involves the drying or curing of the liquid pattern at a temperature which releases or activates the catalyst dissolved in the liquid. Step three includes immersing the substrate with the dried pattern of catalyst material in an electroless copper plating bath which deposits a thin layer (up to 1 micron) of copper only on the substrate surface where there is dried catalytic material. Although copper has been provided here as an appropriate economical example, it will be understood that other suitable metals and materials may alternatively be used in this process.

Figure 10:
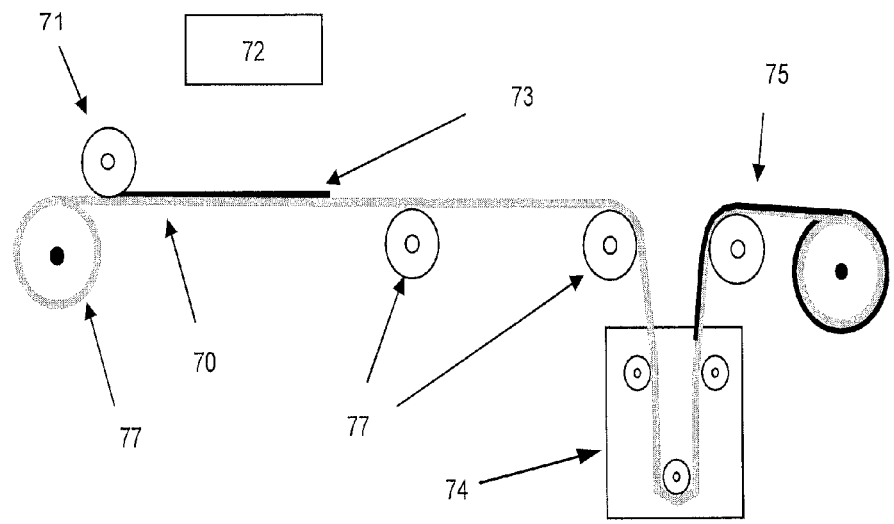
FIG. 10 illustrates a block diagram of an exemplary print and plate process that can be used to create an optically-porous electrically-conductive layer on a roll-to-roll method for flexible substrate material according to one embodiment of the present invention.

This print-and-plate process offers an effective and economical method to create a thin layer of metal with a dense array of openings on a production scale. FIG. 10 is an embodiment of such a print and plate process that can be used to create the optically transparent or porous metalized layer on a roll-to-roll method for a flexible substrate material. A roll of flexible substrate material 77 is threaded through a series of process steps conveyed on other rollers. The first step is the deposition 71 of a pattern of the catalytic precursor liquid 73 on the surface of the flexible substrate material. The deposition mechanism 71 can be one of several different types of printing mechanisms which include gravure printing, offset printing, ink jet printing, and pad printing mechanisms, among others. The pattern of catalytic precursor liquid is then cured or dried 72 at an appropriate temperature using either convection heating or infrared heating. The dry pattern of catalytic material on the substrate is then taken into an electroless copper bath 74 where depending on the dwell time in the bath and the chemical speed of the bad, a thin layer of copper 75 in the range of 0.01 microns to 1.0 microns is deposited. The final step is the roll up of the substrate material with the porous metal pattern strongly adhered to its surface.

Figure 11:
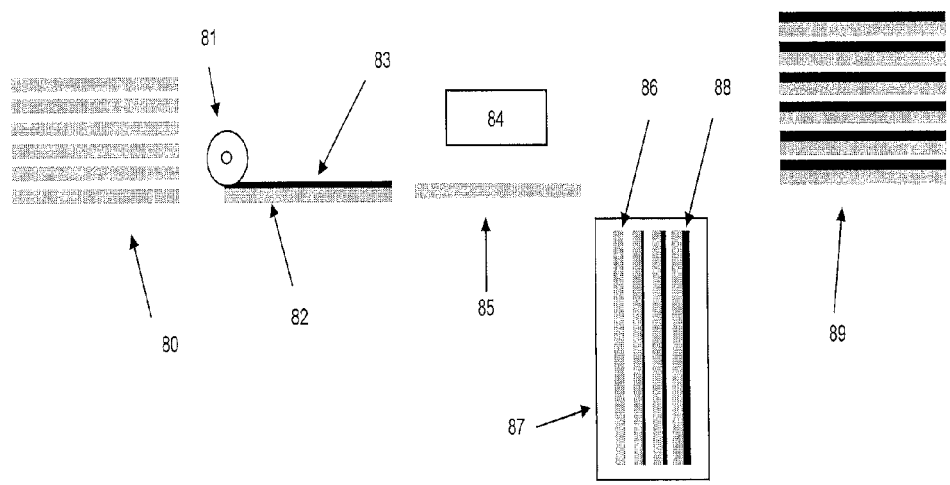
FIG. 11 illustrates a block diagram of an exemplary print and plate process that can be used to create an optically-porous electrically-conductive layer on a planar rigid substrate material according to one embodiment of the present invention.

FIG. 11 is an embodiment of the print and plate process that can be used to create the optically transparent metalized layer on a planar rigid substrate material. One or more sheets of a planar rigid substrate material 80 are fed into a printing mechanism 81 which deposits a pattern of catalytic precursor liquid 83 on the substrate sheet 82. The wet pattern is then dried by a heater 84, which leaves behind a dry pattern 85 that is the same as that created by the printing mechanism 81. The substrate sheet with the dry catalytic pattern is then dipped into an electroless plating bath 87. After a certain dwell time, a thin layer of copper 86, 88 is deposited on the surface only where the dry pattern of catalytic material exists. When the appropriate thickness of copper is achieved, the sheet is removed from the electroless plating bath and is dried and stacked 89.

A variety of components and mixtures can be utilized for a suitable catalytic precursor solution that results in an appropriate precursor for the foregoing process. As one particular example, the precursor can include elemental and active palladium. Active palladium is a metal precursor that works well with many substrates and copper deposition techniques. Active palladium has two desirable properties: (1) it is catalytic for subsequent addition of a metal onto the palladium (such as electroless deposition), and (2) it is strongly anchored to the underlying substrate and to the metal deposited on it. Active palladium can be disposed in minute amounts on the surface and does not need to form a conductive layer by itself, but facilitates subsequent deposition of a metal onto the surface, according to the pattern of the palladium, to form a conductive pattern. The conductive pattern may include one or more conductive lines, or a block deposition of metal according to other shapes that do not resemble lines, as may be desired In one embodiment, the active palladium can have approximately a zero valance. The active palladium is also ideally disposed monoatomically onto the substrate. Elemental palladium does not readily bind to a surface monoatomically or with an approximately zero valance, and needs to be deliberately processed to achieve such a state. The precursor may be deposited as a solution. The precursor, or a precursor solution, may be delivered to a substrate in any of a number of different manners. In one embodiment, the precursor 12 is blank deposited, without a pattern onto the substrate 10 to deposit the precursor. In another embodiment, the precursor solution is delivered only to selective regions of the substrate according to a desired pattern. This spatial selectivity is referred to herein as "printing" the palladium precursor solution on the substrate. In other embodiments, the palladium precursor solution coats the entire substrate or a large portion thereof. This may be accomplished via a printer (where the entire surface is selected for printing), dip coating, or another blank printing procedure, among other suitable techniques. In such cases, the blank palladium precursor solution may or may not be subsequently patterned to produce the pattern.

In one embodiment, the palladium precursor solution includes a Lewis base ligand and a palladium compound in a solvent. A Lewis base ligand (nucleophile) and a palladium compound, such as palladium carboxylate, may be added to a solvent to create the palladium precursor solution. In a specific embodiment, palladium propionate was prepared by treating commercially available palladium acetate in excess propionic acid. The mixture was maintained at about 40° C. for about 24 hours followed by removal of excess propionic acid under a vacuum at room temperature. The resulting solid is soluble in amyl acetate. In another specific embodiment suitable for printing on polyester, a solution of palladium propionate having 0.05% palladium by weight was prepared in amyl acetate. Aniline was added in a stoichiometric amount that corresponds to 2 moles of aniline per gram atom of palladium. This clear solution was then suitable for printing.

Further details regarding catalytic precursors and the formation and use of such items are provided in, for example, commonly owned and co-pending U.S. patent application Ser. No. 11/520,341, titled "FLEXIBLE CIRCUIT CHEMISTRY," Ser. No. 11/520,472, titled "FLEXIBLE CIRCUITS," and Ser. No. 11/520,474, titled "FLEXIBLE CIRCUIT PRINTING," all of which were filed on Sep. 12, 2006, as well as U.S. Provisional Patent Application No. 60/945,513, titled "SYSTEMS AND METHODS FOR CONDUCTIVE PATTERN FORMATION," filed Jun. 21, 2007, with each of these applications being incorporated by reference herein in its entirety and for all purposes.

Figure 12A:
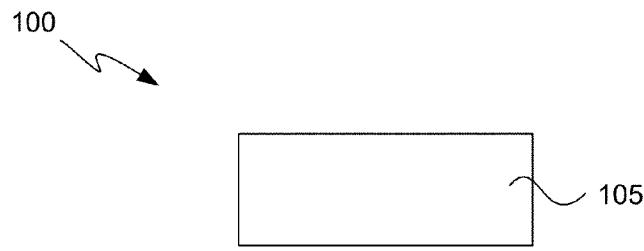
FIG. 12A illustrates in side cross-sectional view an exemplary substrate.
Figure 12B:
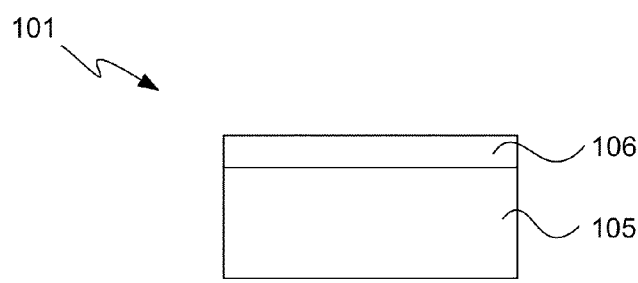
FIG. 12B illustrates in side cross-sectional view the exemplary substrate of FIG. 12A having a traditional ITO layer deposited thereon.
Figure 12C:
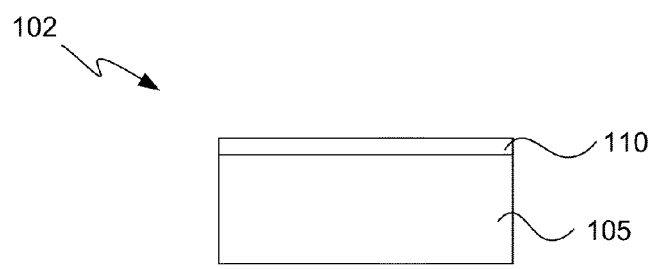
FIG. 12C illustrates in side cross-sectional view the exemplary substrate of FIG. 12A having a thin copper layer deposited thereon according to one embodiment of the present invention.
Figure 12D:
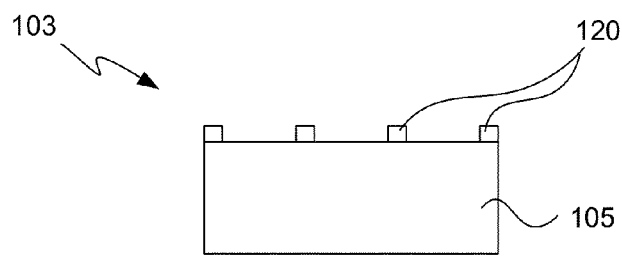
FIG. 12D illustrates in side cross-sectional view the exemplary substrate and copper arrangement of FIG. 12C with the copper layer being patterned to form a plurality of fine openings therethrough according to one embodiment of the present invention.

Turning now to FIGS. 12A through 12D, various substrate and surface layer arrangements are provided, all in side cross-sectional view. In particular, FIG. 12A illustrates a system 100 comprising a substrate 105; FIG. 12B illustrates a system 101 comprising a traditional ITO layer 106 deposited on a substrate 105; and FIG. 12C illustrates a system 102 comprising a thin copper layer 110 deposited on a substrate 105. As noted above, although the copper layer 110 is substantially thinner than the ITO layer 106, this thinner copper layers still has the same or better resistivity as the ITO layer. FIG. 12D illustrates a system 103 having the exemplary substrate 105 and copper arrangement of FIG. 12C with the copper layer being redistributed and patterned to form a plurality of lines 120 having fine openings therethrough in a grid arrangement according to one embodiment of the present invention. Grid arrangement 120 can retain the same mass of copper as in FIG. 12C. In general copper traces or lines 120 so obtained have much lower resistivity than the copper film of FIG. 12C.

Figure 13A:
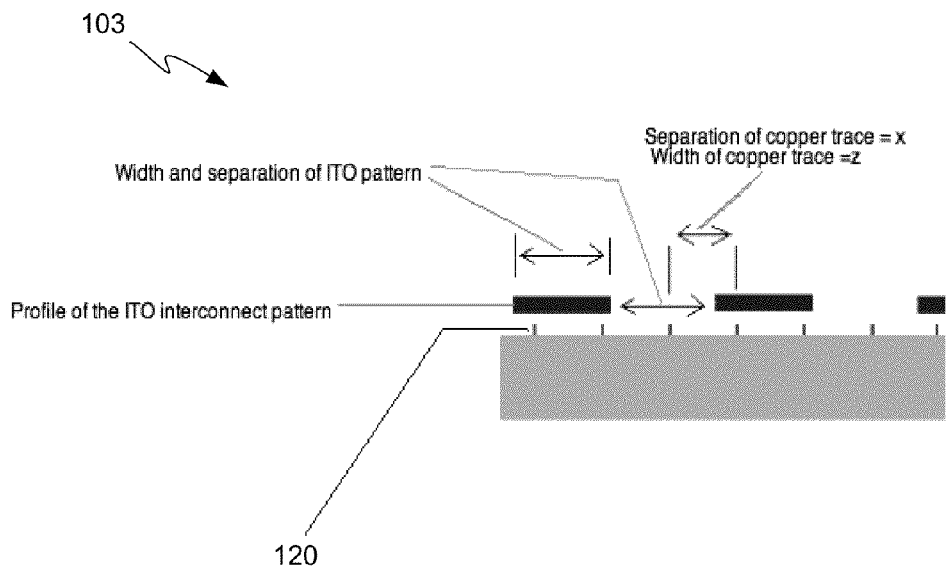
FIG. 13A illustrates in side cross-sectional view a comparison between a traditional ITO layer and the patterned conductive layer disclosed herein.
Figure 13B:
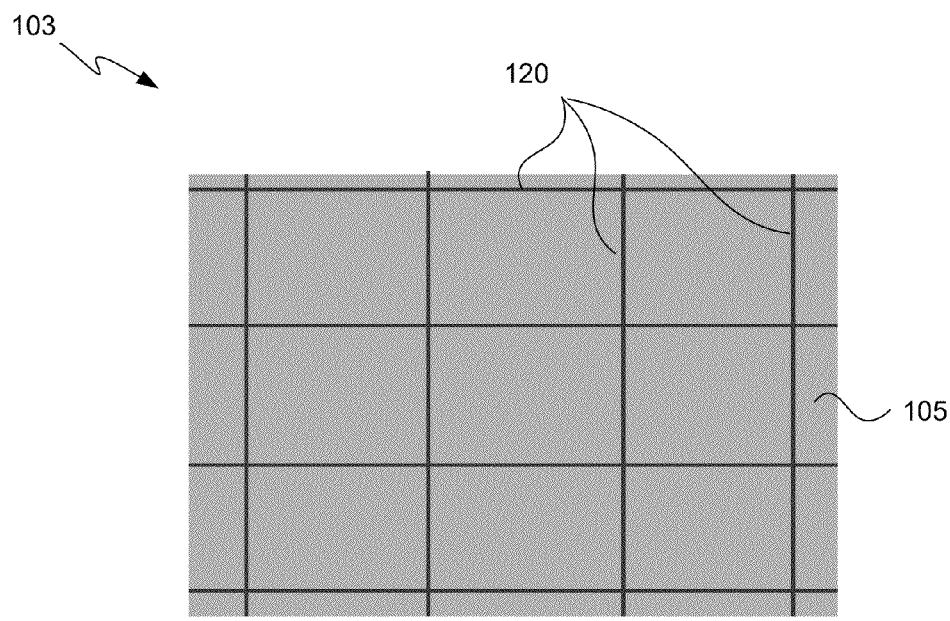
FIG. 13B illustrates in top plan view an exemplary substrate having an optically-porous electrically-conductive layer patterned thereon according to one embodiment of the present invention.

FIG. 13B illustrates in top plan view the exemplary substrate having an optically-porous electrically-conductive layer patterned thereon of FIG. 12D according to one embodiment of the present invention. Looking at FIG. 13B, one can appreciate that the portions of the underlying substrate that are not covered by the copper or other conductive layer or film are transparent to light, while the copper grid itself will obstruct transmission of light. The overall optical transparency of the substrate can be estimated, to the first degree of approximation, by the length and width of the copper traces making up the grid and subtracting that from the total area of the covered region of the substrate. This is further illustrated in FIG. 13A.

A high trace-density copper grid can replace a conventional ITO layer provided it can support an interconnect pattern to provide (i) electrical connectivity and (ii) good optical transparency. Electrical connectivity in a profile of the interconnect pattern can be achieved if the following condition is met: Assume that the width and the separation of the desired interconnect profile (FIG. 13A) is y units and the width of the trace in the grid is z units with a separation of x units, then a one-dimensional interconnect profile, where all the traces are parallel, will have electrical connectivity provided $y>(x+z)$. However, the high density interconnect pattern shown in FIG. 12D is a two-dimensional x-y grid shown in FIG. 13B. A 2-D square-grid (FIG. 13B) can support an interconnect profile provided $y>w\sqrt{2}$; where $w=x+z$.

In order to achieve optical transparency, it is necessary to have bigger trace separation in the high trace density copper grid (i.e., higher value of x) in FIG. 13A. Since metals have zero optical transmission, the ratio x/z determines the overall optical transmission of the substrate having the high trace density copper grid. Neglecting interference losses, the expected percentage of optical transmission of the grid is given by the following expression:

Optical transmission=$100(1-z/x)$

A chrome mask was obtained and its optical transmission was measured. The mask has $2\mu$ (x=2) chrome lines with $23\mu$ separation (z=23). The estimated optical transmission of such a mask is $100(1-2/23)=91.3\%$ and this value can be varied by varying the ratio, z/x. Actual values of transmission may be less than those estimated by this simple relationship.

Figure 14:
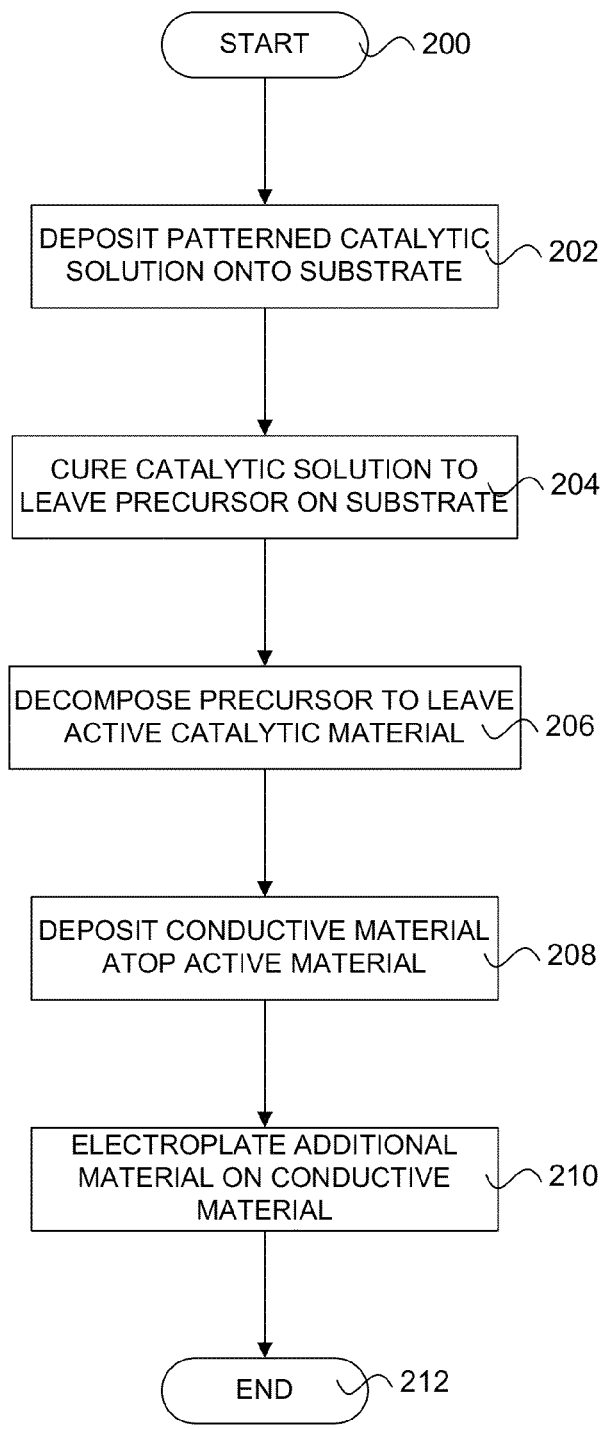
FIG. 14 provides a flowchart of an exemplary method for producing an optically-porous electrically-conductive layer on a substrate according to one embodiment of the present invention.

Turning lastly to FIG. 14, a flowchart of an exemplary method for producing an optically-porous electrically-conductive layer on a substrate according to one embodiment of the present invention is provided. After a start step 200, a catalytic precursor solution or liquid is deposited onto a substrate at process step 202. At subsequent process step 204, the catalytic solution is cured or dried to leave a residual precursor pattern on the substrate. At a following process step 206, the residual precursor can be decomposed to leave an active catalytic material, such as active palladium, for example. After this, a conductive material or film can be deposited atop the active material at process step 208. Such a conductive material can be copper, for example, although other conductive materials may also be used. At an optional process step 210, and additional material may be electroplated on the conductive material, after which the method ends at end step 212. It will be readily appreciated that other steps may be included in this method, and that not all steps are necessary in all situations. For example, step 210 may not be desired for some applications, with the resulting film still being suitable for conductive and optically porous use in an ITO alternative application.

Although the foregoing invention has been described in detail by way of illustration and example for purposes of clarity and understanding, it will be recognized that the above described invention may be embodied in numerous other specific variations and embodiments without departing from the spirit or essential characteristics of the invention. Various changes and modifications may be practiced, and it is understood that the invention is not to be limited by the foregoing details, but rather is to be defined by the scope of the claims.

What is claimed is:

1. An optoelectronic device, comprising:
    a substrate having a surface; and
    an optically-porous electrically-conductive layer on the surface of the substrate, wherein the optically-porous electrically-conductive layer has a pattern that defines a plurality of fine openings therethrough such that the optically-porous electrically-conductive layer has an optical transmissivity of at least 85%, the optically-porous electrically-conductive layer comprising elemental palladium monoatomically bound to the surface of the substrate and an electrically conductive layer disposed on the monoatomically-bound elemental palladium.

2. The optoelectronic device of claim 1, wherein the fine openings have irregular shapes.

3. The optoelectronic device of claim 1, wherein the fine openings are rectangular in shape and have a width of less than 250 microns and a length of less than 250 microns.

4. The optoelectronic device of claim 1, wherein the electrically conductive layer has a thickness of less than about 250 microns.

5. The optoelectronic device of claim 1, wherein the substrate with the optically-porous electrically-conductive layer adhered thereto is flexible.

6. The optoelectronic device of claim 1, wherein the substrate is rigid.

7. The optoelectronic device of claim 1, wherein the electrically conductive layer comprises copper.

8. The optoelectronic device of claim 1, further comprising an additional layer of material electroplated on the electrically conductive layer.

* * * * *